(12) United States Patent
Lee

(10) Patent No.: US 7,687,345 B2
(45) Date of Patent: Mar. 30, 2010

(54) FLASH MEMORY DEVICE AND METHOD OF MANUFACTURING THE SAME

(75) Inventor: Sang Bum Lee, Yeonsoo-gulncheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 577 days.

(21) Appl. No.: 11/646,103

(22) Filed: Dec. 26, 2006

(65) Prior Publication Data

US 2007/0145460 A1 Jun. 28, 2007

(30) Foreign Application Priority Data

Dec. 27, 2005 (KR) .................. 10-2005-0130756

(51) Int. Cl.
*H01L 21/336* (2006.01)
(52) U.S. Cl. .............. 438/257; 438/201; 438/211; 438/270; 257/E21.68; 257/E29.129; 257/E29.3; 257/E21.179; 257/E21.422
(58) Field of Classification Search .............. 257/314, 257/315, 330, E21.68, E29.129, E29.3, E21.179, 257/E21.422; 438/201, 211, 257, 270
See application file for complete search history.

(56) References Cited

U.S. PATENT DOCUMENTS

| 6,083,793 A | * | 7/2000 | Wu | .............. 438/270 |
|---|---|---|---|---|
| 7,211,487 B2 | * | 5/2007 | Chindalore | .............. 438/270 |
| 7,351,636 B2 | * | 4/2008 | Jeon et al. | .............. 438/257 |
| 2005/0236664 A1 | * | 10/2005 | Aoki et al. | .............. 257/330 |
| 2005/0253189 A1 | * | 11/2005 | Cho et al. | .............. 257/330 |
| 2007/0007586 A1 | * | 1/2007 | Tempel | .............. 257/330 |
| 2007/0018207 A1 | * | 1/2007 | Prinz | .............. 257/288 |

\* cited by examiner

*Primary Examiner*—Michelle Estrada
(74) *Attorney, Agent, or Firm*—The Law Offices of Andrew D. Fortney; Andrew D. Fortney; William K. Nelson

(57) ABSTRACT

Disclosed are a flash memory device having a silicon-oxide-nitride-oxide-silicon (SONOS) structure and a method of manufacturing the same. The flash memory device includes source and drain diffusion regions separated from each other on opposite sides of a trench in an active region of a semiconductor substrate, a control gate inside the trench and protruding upward from the substrate, a charge storage layer between the control gate and an inner wall of the trench, and a pair of insulating spacers formed on opposite sidewalls of the control gate with the charge storage layer therebetween. Here, the charge storage layer has an oxide-nitride-oxide (ONO) structure. Further, the depth of the trench from the surface of the substrate is greater than that of each of the source and drain diffusion regions.

20 Claims, 6 Drawing Sheets

FLASH MEMORY DEVICE AND METHOD OF MANUFACTURING THE SAME

This application claims the benefit of Korean Application No. 10-2005-0130756, filed on Dec. 27, 2005, which is incorporated by reference herein in its entirety.

BACKGROUND OF THE INVENTION

1. Field of the Invention

The present invention relates to a semiconductor device. More specifically, the present invention relates to a flash memory device and a method of manufacturing the same.

2. Description of the Related Art

In general, a flash memory is a kind of PROM (programmable ROM) that is capable of electrically re-writing data. The flash memory can perform programming like an erasable PROM (EPROM) and erasing like an electrically erasable PROM (EEPROM) using one transistor. Flash memory combines the advantages of an EPROM, in which a memory cell includes one transistor so that a cell area is small, and the EEPROM, in which data can be electrically erased. However, in an EPROM, data must be erased at one time by UV rays. In addition, an EEPROM cell includes two transistors, so that a cell area becomes large. Another name of the flash memory is a flash EEPROM. The flash memory is referred to as a nonvolatile memory since stored information is not erased although power is turned off, which is different from a dynamic RAM (DRAM) or a static RAM (SRAM).

The flash memory may be classified as a NOR-type structure in which cells are arranged in a row between a bit line and a ground, or a NAND-type structure in which cells are arranged in series between the bit line and the ground. Since the NOR-type flash memory having the parallel structure can perform high speed random access when a reading operation is performed, the NOR-type flash memory is widely used for booting a mobile telephone. The NAND-type flash memory having the serial structure has low reading speed but high writing speed so that the NAND-type flash memory is suitable for storing data and is advantageous for miniaturization. The flash memory cell may be classified as a stack gate type or a split gate type in accordance with the gate structure in a unit cell. In addition, nonvolatile memory can be classified as a floating gate device or a silicon-oxide-nitride-oxide-silicon (SONOS) device in accordance with the materials in the charge storage layer.

Among them, the SONOS type flash memory may have better reliability than the floating gate type flash memory, and it is possible to perform programming and erasing operations at low voltage, because the gate insulating layer includes a charge storage layer (usually an oxide-nitride-oxide (ONO) structure which comprises a silicon oxide tunneling layer, a silicon nitride trapping layer, and a silicon oxide blocking layer), and because a charge is trapped in a deep energy level corresponding to the nitride layer.

FIG. 1 shows a structure of an ordinary SONOS type flash memory. Referring to FIG. 1, a multilayered charge storage layer 18 is interposed between a substrate 10 and a control gate 20. The multilayered charge storage layer 18 is formed by stacking a tunnel oxide layer 18a, a silicon nitride layer 18b, and a blocking oxide layer 18c. The control gate 20 is formed on the multilayered charge storage layer 18, and has sidewall insulating spacers 22 on sidewalls thereof.

Meanwhile, in the case of the SONOS type flash memory, the control gate 20 formed as described above is formed into a word line. In order to increase an integration density of the flash memory, the control gate 20 constructing a plurality of word lines must have very small critical dimension (CD). Recently, the CD of the control gate 20 has been scaled down to a nano scale. In this manner, when the width of a gate is reduced, a channel formed underneath the gate is also very narrow. When a length of the channel is shortened, a so-called short channel effect can give rise to a phenomenon in which a relatively large current abruptly flows between a drain and a source. Thus, a threshold voltage of the flash memory may be lowered and cause a malfunction.

SUMMARY OF THE INVENTION

The present invention has been made to solve the above problem(s), and therefore, it is an object of the present invention to provide a flash memory device having a silicon-oxide-nitride-oxide-silicon (SONOS) structure and a method of manufacturing the same, capable of sufficiently maintaining the length of a channel even though the width of a control gate is very narrow.

It is another object of the present invention to provide a method of manufacturing a flash memory device, capable of forming a control gate having a nano-scale critical dimension (CD) without performing a separate process of patterning the control gate. Meanwhile, expensive exposure equipment must be used to pattern the control gate on a nano scale. However, according to the present invention, the control gate having a nano-scale CD can be formed without nano-scale exposure equipment.

According to one aspect of the present invention, there is provided a flash memory device, which includes source and drain diffusion regions on opposite sides of a trench in an active region of a semiconductor substrate, a control gate inside the trench and protruding upward from the substrate, a charge storage layer between an inner wall of the trench and the control gate, and insulating spacers on opposite sidewalls of the control gate with the charge storage layer therebetween. Here, the charge storage layer may have an oxide-nitride-oxide (ONO) structure. Further, a depth from a surface of the substrate to a bottom of the trench may be greater than that of each of the source and drain diffusion regions.

According to another aspect of the present invention, there is provided a method of manufacturing a flash memory device. The method comprises the steps of: (a) forming a hard mask layer on an active region of a semiconductor substrate, (b) patterning the hard mask layer (and etching the exposed substrate) to form a first trench, (c) forming hard mask spacers on an inner wall of the first trench, (d) etching the substrate to a predetermined depth using the hard mask layer and the hard mark spacers as an etch mask to form a second trench on the substrate, (e) forming a charge storage layer on an inner wall of each of the hard mark spacers and second trench, (f) forming a conductive layer on the charge storage layer to fill a remaining gap in the second trench and the hard mask spacers, and optionally (g) removing the hard mask layer and the hard mask spacers to form a control gate that has the charge storage layer between the substrate and the control gate.

The control gate may protrude upward beyond the substrate from the second trench. The charge storage layer maybe between an inner wall of the trench and the control gate. Further, the method may further comprise the step of forming lightly doped drain regions, and source and drain diffusion regions, both of which are separated by the second trench, in the substrate. The method may further comprise the step of forming insulating spacers on opposite sidewalls of the control gate.

DETAILED DESCRIPTION OF THE INVENTION

Hereinafter, a method of manufacturing a flash memory device, and more particularly a method of patterning a gate of a semiconductor device, according to the present invention will be described in detail with reference to the following drawings.

Embodiment 1

Figure 1:
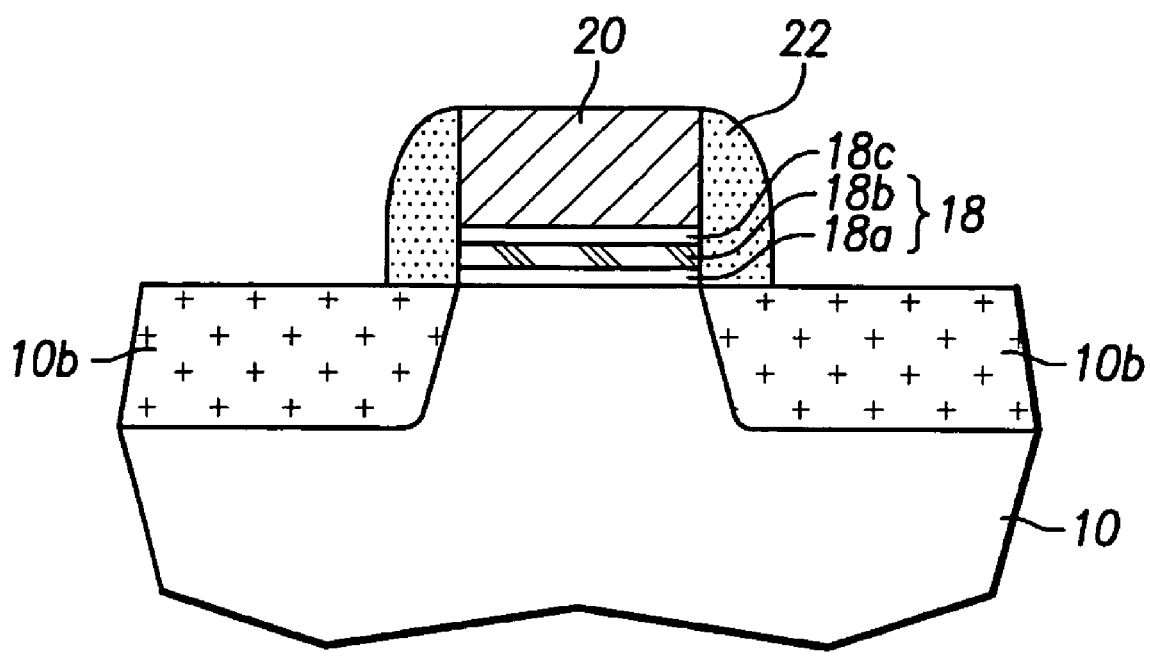
FIG. 1 is a sectional view of a conventional flash memory device having a silicon-oxide-nitride-oxide-silicon (SONOS) structure.
Figure 2:
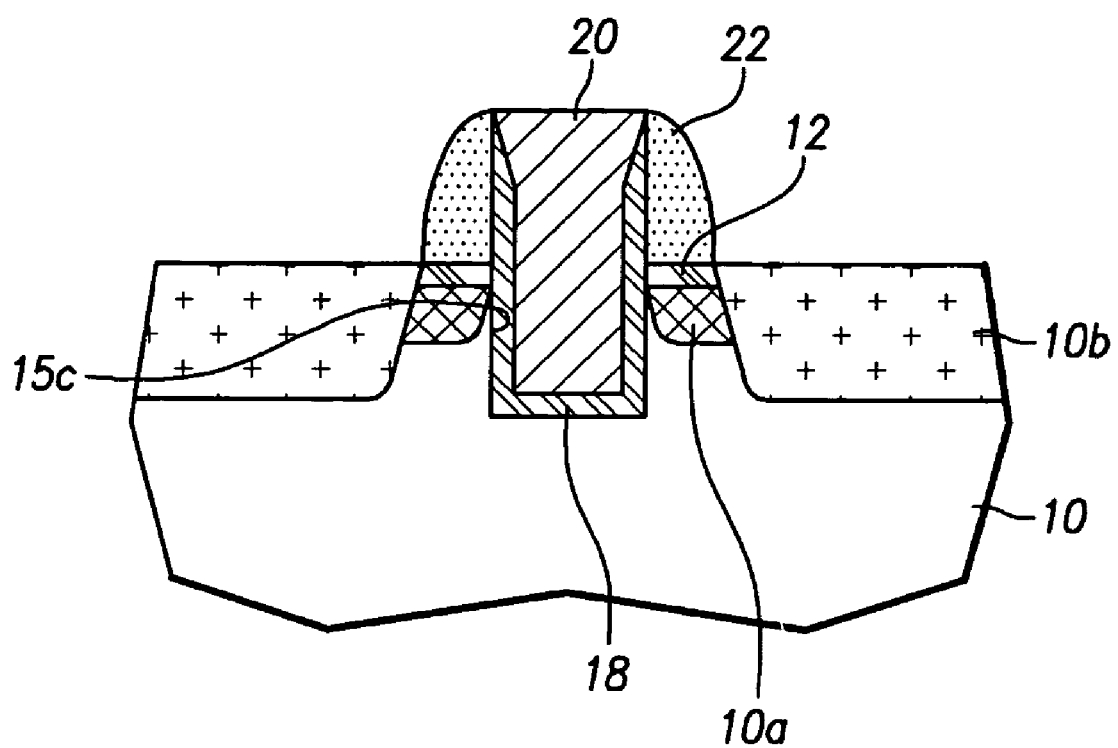
FIG. 2 is a sectional view of a flash memory device having a SONOS structure according to the present invention.

FIG. 2 is a sectional view of a flash memory device having a silicon-oxide-nitride-oxide-silicon (SONOS) structure according to the present invention.

As shown in FIG. 2, a trench 15c is formed in an active region of a semiconductor substrate 10 which is defined by isolation layers (not shown) having a predetermined depth. Further, a control gate 20 protrudes upward beyond the substrate 10 from inside the trench 15c. A charge storage layer 18 having an oxide-nitride-oxide (ONO) structure surrounds the control gate 20, and is thus between an inner wall of the trench 15c and an outer wall of the control gate 20. Insulating spacers 22 are formed on the sidewalls of the control gate 20 which are enclosed by the charge storage layer 18. Lightly doped drain (LDD) regions 10a are mutually isolated in the substrate underneath the pair of insulating spacers 22 by means of the trench 15c. In addition, source and drain diffusion regions 10b are formed in the substrate on the left and right sides of the insulating spacers 22 respectively. The source and drain diffusion regions 10b are also isolated mutually by the trench 15c.

In the flash memory device of the above-described structure, a depth from the surface of the substrate to a bottom of the trench 15c is deeper than that of each of the source and drain diffusion regions 10b. In this manner, because the source and drain diffusion regions 10b are isolated from each other by the trench 15c, the length of a channel is prolonged. In the conventional flash memory device, when the width of the control gate 20 is formed on a nano scale, the short channel effect can take place due to the shortened channel length. However, in the flash memory device of the above-described structure, although the width of the control gate 20 is formed on a nano scale, the channel length is prolonged, so that the short channel effect can be effectively prevented.

Embodiment 2

A method of manufacturing a flash memory device according to the present invention will be described with reference to FIGS. 3A through 3H.

Figure 3A:
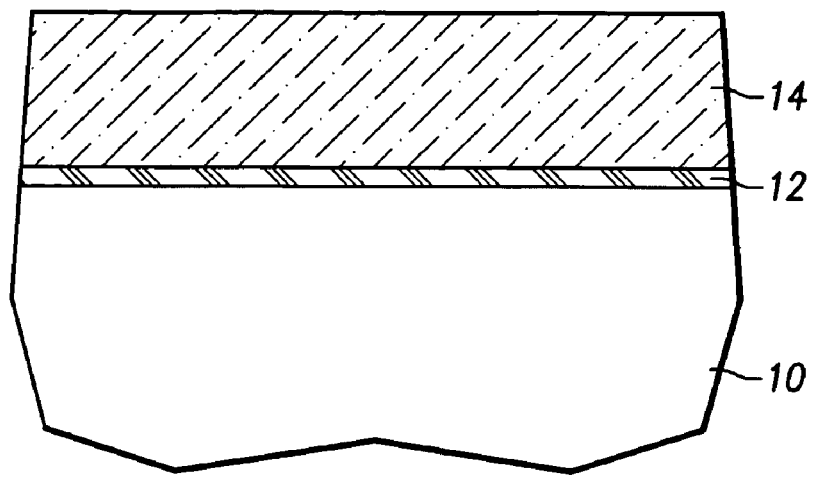
FIGS. 3A through 3H are sectional views for explaining a method of manufacturing a flash memory device according to the present invention.

First, referring to FIG. 3A, after isolation layers (not shown) are formed to define the active device region of a silicon substrate 10, an oxide layer 12 is formed on the active device region. The oxide layer 12 functions as a buffer layer that prevents damage to the silicon substrate 10, which can occur when a nitride layer 14 is directly formed on the silicon substrate 10.

Figure 3B:
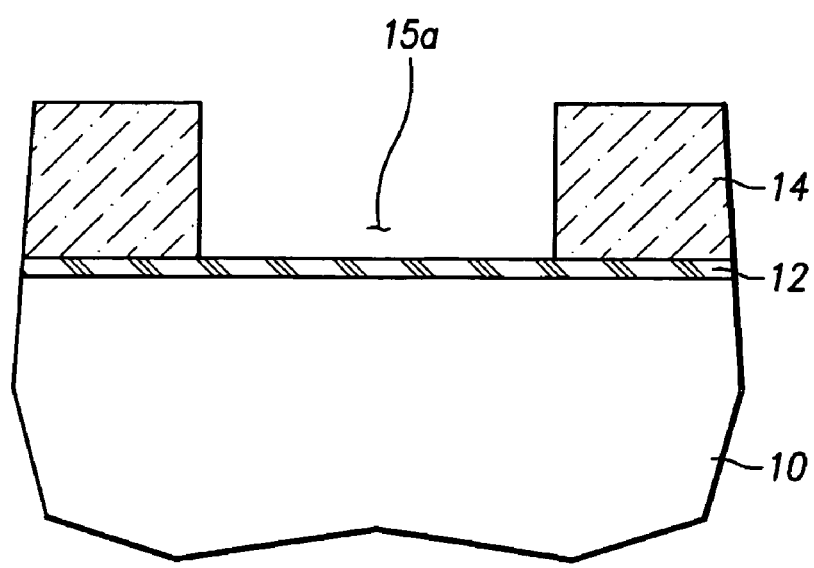

Next, referring to FIG. 3B, the nitride layer 14 is patterned through photolithography and etching processes, and thereby a first trench 15a is formed. A surface of the oxide layer 12 is exposed by the first trench 15a.

Figure 3C:
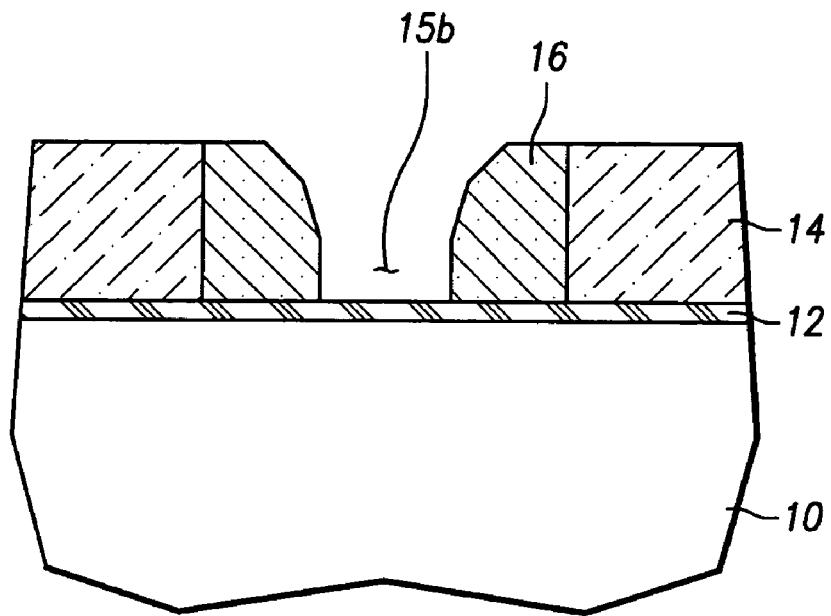

Subsequently, referring to FIG. 3C, hard mask spacers 16 are formed on opposite inner walls of the first trench 15a so as to be spaced apart from each other by a predetermined interval. Thus, a gap 15b is formed between the hard mask spacers 16. The hard mask spacers 16 are formed by forming a hard mask layer on the nitride layer 14 and in the first trench 15a, and then etching back the hard mask layer (e.g., by anisotropic etching). Especially, each of the hard mask spacers 16 preferably comprises the same material (e.g., silicon nitride) as the hard mask layer.

Figure 3D:
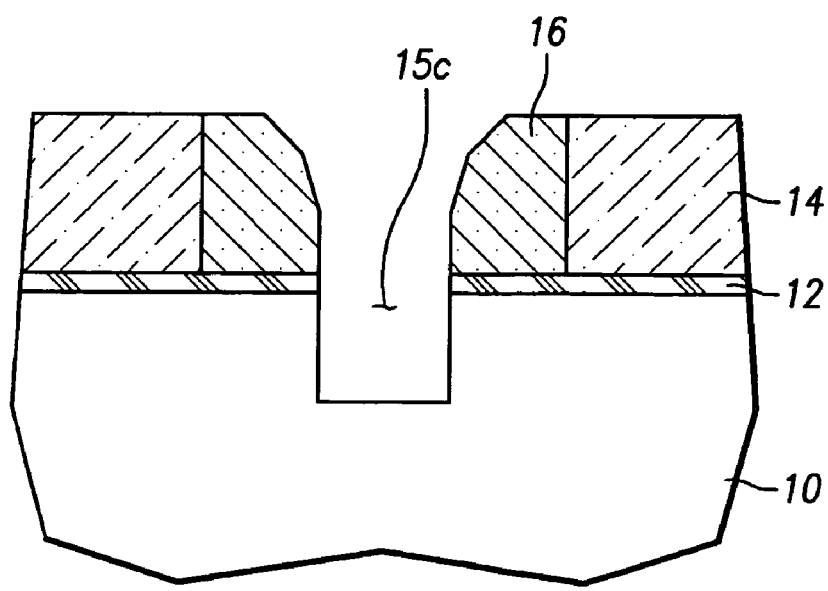

Next, referring to FIG. 3D, the substrate 10 is etched to a predetermined depth (e.g., from 1000, 1500 or 2000 Å to 3500, 4000 or 5000 Å) using the nitride layer 14 and hard mask spacers 16 as an etch mask, and thereby forming a second trench 15c. At this time, the second trench 15c is formed at a width corresponding to the gap 15b between the hard mask spacers 16 (e.g., from 130 nm, 100 nm, 90 nm, 65 nm or less). Especially, the second trench 15c preferably has a depth greater than the source and drain diffusion regions, which are formed in a subsequent process.

Figure 3E:
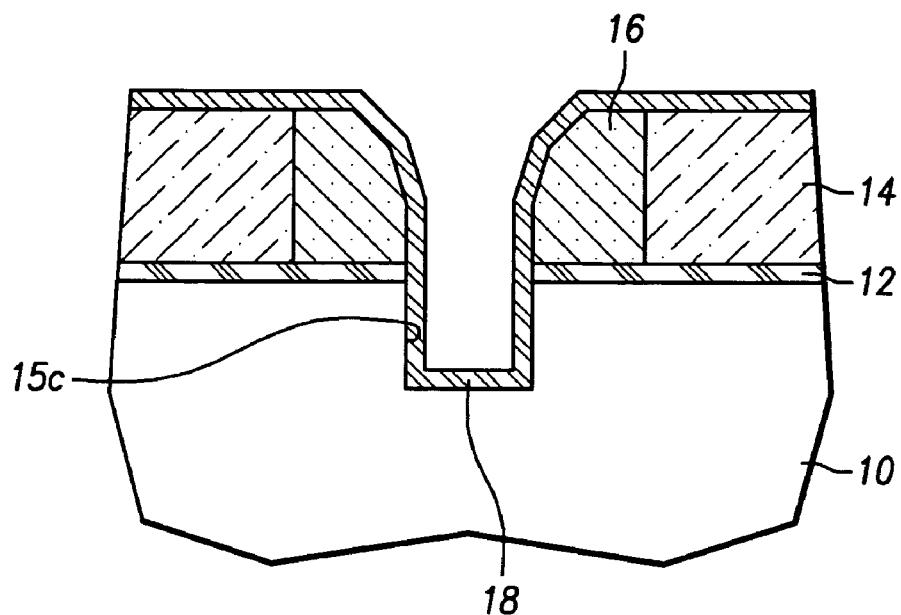

Next, referring to FIG. 3E, a charge storage layer 18 is deposited on the entire substrate 10. More specifically, at least parts of the charge storage layer 18 is uniformly deposited on the nitride layer 14, the hard mask spacers 16, and in the second trench 15c. The charge storage layer 18 can include an ONO layer, and is formed on the hard mask spacers 16 and the second trench 15c at a predetermined thickness. Each layer in the charge storage layer 18 can be deposited by chemical vapor deposition, and optionally annealed to densify the layer(s), but the tunnel oxide layer may be formed by wet or dry thermal oxidation of exposed silicon (e.g., in the second trench 15c), so it may not cover the entire substrate.

Figure 3F:
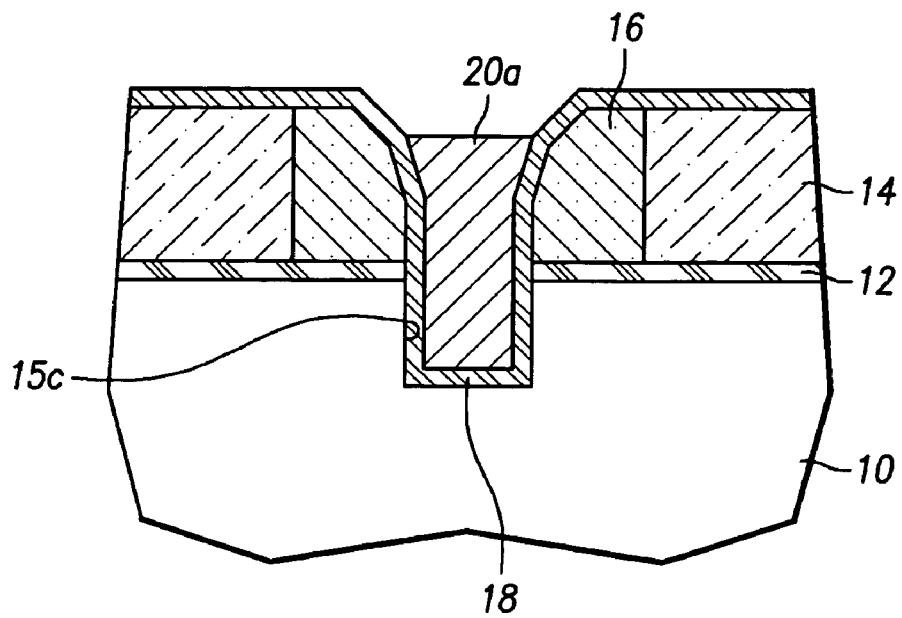

Next, referring to FIG. 3F, a conductive layer 20a is deposited on the charge storage layer 18. More specifically, the conductive layer 20a is formed to fill a space or a remaining gap that is defined by the hard mask spacers 16 and the second trench 15c. Here, the conductive layer 20a can comprise polysilicon into which impurities are doped, a conductor such as TiN, TaN or a metal silicide, or a metal such as tungsten, aluminum or copper. After deposition, the conductive layer 20a may be removed from areas outside the second trench 15c by polishing (e.g., chemical mechanical polishing) or etch back (e.g., anisotropic etching).

Figure 3G:
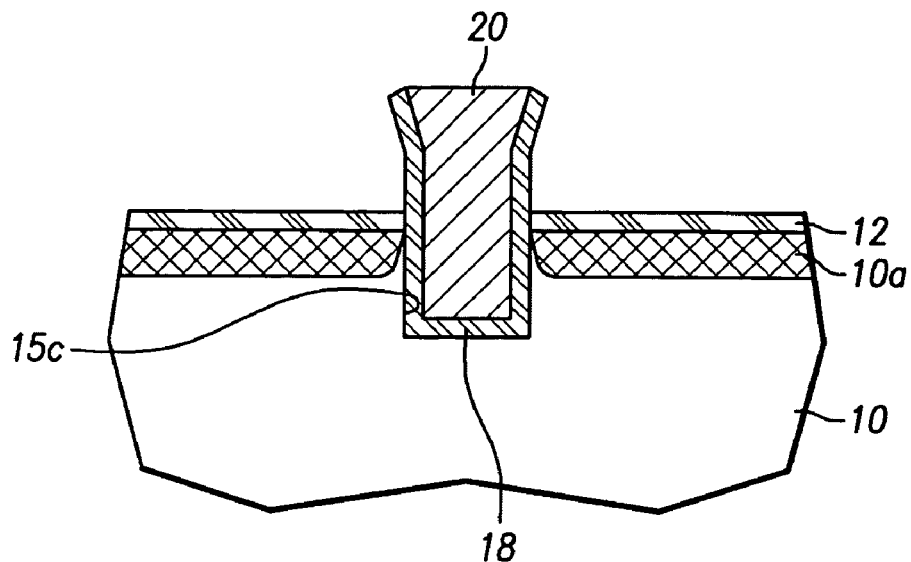

Subsequently, the nitride layer 14 and the hard mask spacers 16 are removed, and thereby a control gate 20 having a structure as in FIG. 3G is formed. The charge storage layer 18 and the conductive layer 20a are in the gap 15b between the hard mask spacers 16, in the second trench 15c, and on the nitride layer 14. However, part of the charge storage layer 18 formed on the nitride layer 14 and part of the conductive layer 20a can be removed together with the nitride layer 14. Further, the nitride layer 14 is preferably removed using a wet etching process, and more preferably using a phosphoric acid solution that can selectively remove the silicon nitride layer. In addition, when the hard mask spacers 16 comprise silicon nitride, they can be simultaneously removed together with the nitride layer 14. Alternatively, the conductive layer 20a, part of the charge storage layer 18, and part or all of the hard mask spacers 16 may be photolithographically masked with a photoresist, and the remaining portions of the charge storage layer 18 and the nitride layer 14 can be removed by dry (chemical and/or plasma) etching.

FIG. 3G shows the state in which the nitride layer 14 and the hard mask spacers 16 are selectively removed to form the charge storage layer 18 and the control gate 20. Further, in FIG. 3G, lightly doped drain (LDD) regions 10a may be formed by injecting a dopant into the substrate 10 using the control gate 20 as a mask. As shown in FIG. 3G, the LDD regions 10a are mutually isolated on left and right sides of the second trench 15c formed in the substrate, respectively. Alternatively, when part or all of the hard mask spacers 16 remain, LDD regions 10a (which may have a similar structure to those shown in FIG. 3G) may be formed by tilt or halo ion implantation, as long as the depth of the LDD implant regions does not exceed the depth of the second trench.

Figure 3H:
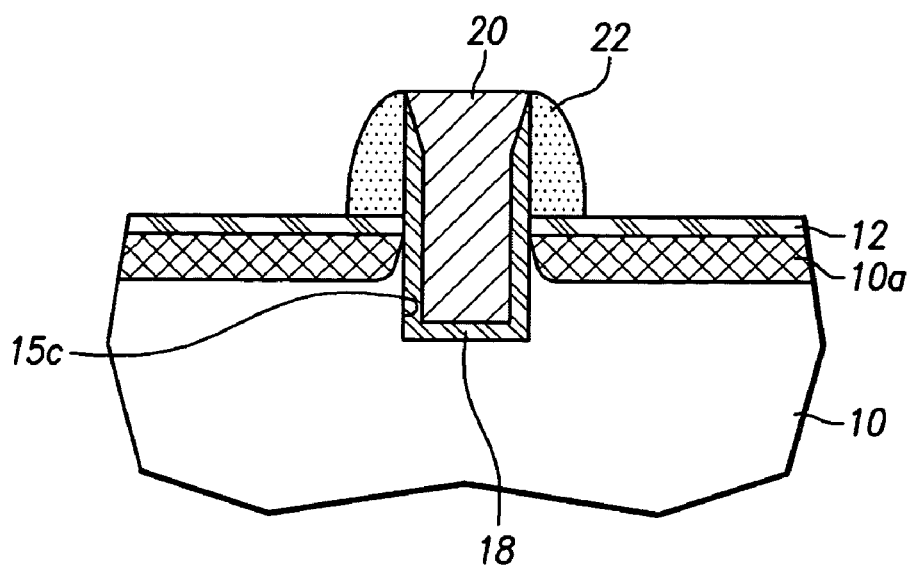

Next, as shown in FIG. 3H, insulating spacers 22, opposite to each other across the control gate 20, are formed on left- and right-hand sidewalls of the control gate 20. Here, the charge storage layer 18 is between the control gate 20 and the insulating spacers 22. The insulating spacers 22 can comprise a silicon nitride layer. To this end, the silicon nitride layer is deposited on the front surface of the substrate, and is then etched back. Continuously, source and drain diffusion regions 10b are formed in the substrate by ion-implanting a dopant using the insulating spacers 22 as a mask. The source and drain diffusion regions 10b formed in this way are formed at a depth shallower than that of the second trench 15c, and are thereby isolated mutually by the second trench 15c.

As can be seen from the foregoing, according to the present invention, the flash memory device can have the SONOS structure in which, although the width of the control gate is very narrowly formed, the channel length can be sufficiently maintained. Hence, although a control gate having a nano-scale width is formed, the phenomenon in which the threshold voltage is lowered by the short channel effect can be prevented. Further, because the CD of the control gate can be adjusted using the hard mask spacers, a separate patterning (direct) process is not required. Consequently, the control gate having the nano-scale CD can be easily formed without nano-scale exposure equipment.

While the invention has been shown and described with reference to certain preferred embodiments thereof, it will be understood by those skilled in the art that various changes in form and details may be made therein without departing from the spirit and scope of the invention as defined by the appended claims.

What is claimed:

1. A method of manufacturing a flash memory device, the method comprising the steps of:
    (a) forming a hard mask layer on a semiconductor substrate;
    (b) patterning the hard mask layer to form a first trench in an active region of the semiconductor substrate;
    (c) forming hard mask spacers on an inner wall of the first trench;
    (d) etching the substrate to a predetermined depth using the hard mark spacers as an etch mask to form a second trench in the substrate;
    (e) forming a charge storage layer on an inner wall of each of the hard mark spacers and the second trench;
    (f) forming a conductive layer on the charge storage layer to fill a remaining gap in the second trench; and
    (g) removing the hard mask layer and the hard mask spacers to form a control gate with the charge storage layer between the substrate and the control gate.

2. The method of claim 1, wherein the hard mask layer includes a material identical to a material forming the hard mask spacers.

3. The method of claim 1, wherein the control gate comprises the conductive layer, protruding upward beyond the substrate from inside the second trench.

4. The method of claim 1, wherein the charge storage layer is between an inner wall of the trench and the control gate.

5. The method of claim 1, further comprising the step of, after forming the control gate, forming lightly doped drain regions in the substrate.

6. The method of claim 1, further comprising the step of, after forming the control gate, forming an insulating spacer on a sidewall of the control gate with the charge storage layer between the insulating spacer and the sidewall.

7. The method of claim 1, further comprising forming source and drain diffusion regions in the substrate.

8. The method of claim 7, wherein the second trench has a depth greater than a depth of the source and drain diffusion regions.

9. The method of claim 1, further comprising forming an oxide layer on the active area of the semiconductor substrate.

10. The method of claim 1, wherein the predetermined depth is from 1000 Å to 5000 Å.

11. The method of claim 1, wherein the second trench has a width of from 65 to 130 nm.

12. The method of claim 1, wherein forming the charge storage layer comprises depositing an ONO layer by chemical vapor deposition.

13. The method of claim 12, further comprising annealing the ONO layer.

14. The method of claim 1, wherein the conductive layer comprises doped polysilicon, TiN, TaN, a metal silicide, tungsten, aluminum, or copper.

15. The method of claim 1, further comprising removing the conductive layer from areas outside of the second trench by chemical mechanical polishing or etch back.

16. The method of claim 1, wherein the hard mask layer and the hard mask spacers each comprise a nitride layer.

17. The method of claim 16, wherein removing the hard mask layer and the hard mask spacers comprises etching with a phosphoric acid solution.

18. The method of claim 1, wherein removing the hard mask layer and the hard mask spacers comprises masking the conductor layer, the charge storage layer, and part of the hard mask spacer, and dry etching the hard mask layer and hard mask spacer.

19. The method of claim 5, wherein forming the lightly doped drain regions comprises a tilt or halo ion implantation.

20. The method of claim 6, wherein the insulating spacer comprises a silicon nitride layer.

* * * * *